US011228022B2

(12) United States Patent
Ge et al.

(10) Patent No.: US 11,228,022 B2
(45) Date of Patent: Jan. 18, 2022

(54) DISPLAY PANEL AND DISPLAY DEVICE

(71) Applicant: Yungu (Gu'an) Technology Co., Ltd., Langfang (CN)

(72) Inventors: Lin Ge, Langfang (CN); Wenzhi Fan, Langfang (CN); Shixing Cai, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 55 days.

(21) Appl. No.: 16/836,373

(22) Filed: Mar. 31, 2020

(65) Prior Publication Data

US 2020/0227687 A1 Jul. 16, 2020

Related U.S. Application Data

(63) Continuation of application No. PCT/CN2019/079691, filed on Mar. 26, 2019.

(30) Foreign Application Priority Data

Sep. 28, 2018 (CN) .......................... 201821592046.7

(51) Int. Cl.
*H01L 51/52* (2006.01)

(52) U.S. Cl.
CPC .... *H01L 51/5278* (2013.01); *H01L 2251/558* (2013.01)

(58) Field of Classification Search
CPC ......... H01L 21/02321; H01L 29/66803; H01L 21/02271; H01L 21/324
See application file for complete search history.

(56) References Cited

U.S. PATENT DOCUMENTS

2008/0067926 A1 3/2008 Mizuno et al.
2015/0144926 A1* 5/2015 Lee ..................... H01L 51/5278
257/40

FOREIGN PATENT DOCUMENTS

| CN | 1615059 A | 5/2005 |
| CN | 104253235 A | 12/2014 |
| CN | 104409648 A | 3/2015 |
| CN | 104681734 A | 6/2015 |
| CN | 104681735 A | 6/2015 |

(Continued)

OTHER PUBLICATIONS

International Search Report (ISR) and Written Opinion (WO) dated Jul. 3, 2019 for Application No. PCT/CN2019/079691.

(Continued)

*Primary Examiner* — Anthony Ho
(74) *Attorney, Agent, or Firm* — Ladas & Parry LLP

(57) ABSTRACT

Provided are a display panel and a display device. The display panel includes a substrate; multiple light emitting units which is disposed on one side of the substrate and arranged in an array, and each of the multiple light emitting unit includes a first light emitting subunit, a second light emitting subunit and a third light emitting subunit, where the light emitting unit includes a first electrode disposed close to the substrate, a second electrode disposed opposite to the first electrode, and a second light emitting layer disposed between the first electrode and the second electrode, at least the third light emitting subunit includes at least one first light emitting layer disposed between the second light emitting layer and the first electrode.

20 Claims, 12 Drawing Sheets

(56) References Cited

FOREIGN PATENT DOCUMENTS

| | | |
|---|---|---|
| CN | 107579160 A | 1/2018 |
| CN | 108155206 A | 6/2018 |

OTHER PUBLICATIONS

Espacenet English Abstract of CN 104681734 A.
Espacenet English Abstract of CN 1615059 A.
Espacenet English Abstract of CN 104681735 A.
Espacenet English Abstract of CN 108155206 A.
Espacenet English Abstract of CN 107579160 A.
Espacenet English Abstract of CN 104253235 A.
Espacenet English Abstract of CN 104409648 A.

* cited by examiner

US 11,228,022 B2

DISPLAY PANEL AND DISPLAY DEVICE

CROSS-REFERENCE TO RELATED APPLICATIONS

This is a continuation application of International Patent Application No. PCT/CN2019/079691, filed on Mar. 26, 2019, which claims priority to Chinese patent application No. 201821592046.7 filed on Sep. 28, 2018, contents of both of which are incorporated herein by reference in their entireties.

TECHNICAL FIELD

The present application relates to the technical field of display.

BACKGROUND

An organic light emitting diode (OLED) has self-luminous light emitting characteristics and does not require a backlight source. When the organic light emitting diode is applied to the display panel and the display device, the display panel and the display device have less overall thickness, which is advantageous for achieving light and thin design of the display panel and the display device. Meanwhile, the organic light emitting diode has the advantages of high display brightness, wide viewing angle, high response speed and the like.

SUMMARY

The present application provides a display panel and a display device, so as to improve the light emitting intensity of a light emitting unit and further to improve the display brightness of the display panel and the display device.

The present application provides a display panel, includes a substrate; multiple light emitting units, which is positioned on one side of the substrate and arranged in an array, and each of the light emitting units includes a first light emitting subunit, a second light emitting subunit and a third light emitting subunit. Each of the light emitting unit includes a first electrode positioned close to the substrate, a second electrode positioned opposite to the first electrode, and a second light emitting layer positioned between the first electrode and the second electrode. At least the third light emitting subunit includes at least one first light emitting layer positioned between the second light emitting layer and the first electrode.

In an embodiment, at least one of the first light emitting subunit or the second light emitting subunit includes at least one first light emitting layer.

In an embodiment, at least one of the number of the at least one first light emitting layer in the first light emitting subunit or the number of the at least one first light emitting layer in the second light emitting subunit is equal to the number of the at least one first light emitting layer in the third light emitting subunit.

In an embodiment, in the first light emitting subunit, a light emitting wavelength of the first light emitting layer is less than a light emitting wavelength of the second light emitting layer; in the second light emitting subunit, a light emitting wavelength of the first light emitting layer is less than a light emitting wavelength of the second light emitting layer; and in the third light emitting subunit, a light emitting wavelength of the first light emitting layer is less than or equal to a light emitting wavelength of the second light emitting layer.

In an embodiment, a light emitting color of the first light emitting layer is blue, a light emitting color of the second light emitting layer in the first light emitting subunit is red, a light emitting color of the second light emitting layer in the second light emitting subunit is green, and a light emitting color of the second light emitting layer in the third light emitting subunit is blue.

In an embodiment, the light emitting unit further includes a charge generation layer, the charge generation layer is positioned between the first light emitting layer and the second light emitting layer adjacent to each other, when the number of the first light emitting layer is at least two, the charge generation layer is further positioned between two adjacent first light emitting layers.

In an embodiment, at least two of the charge generation layer in the first light emitting subunit, the charge generation layer in the second light emitting subunit and the charge generation layer in the third light emitting subunit are continuously positioned.

In an embodiment a thickness of the charge generation layer is represented by A, 10 nm≤A≤30 nm.

In an embodiment, the light emitting unit further includes a first carrier function layer and a second carrier function layer; the first carrier function layer is positioned between the first electrode and a first light emitting layer immediately adjacent to the first electrode, between the first light emitting layer and the charge generation layer immediately adjacent to the first light emitting layer and close to the first electrode, and between the second light emitting layer and the charge generation layer immediately adjacent to the second light emitting layer. The second carrier function layer is positioned between the second electrode and the second light emitting layer, and between the first light emitting layer and the charge generation layer immediately adjacent to the first light emitting layer and close to the second electrode.

In an embodiment, in a same light emitting unit, the first carrier function layer in at least part of the first light emitting subunit, the first carrier function layer in at least part of the second light emitting subunit, and the first carrier function layer in at least part of the third light emitting subunit are continuously positioned.

In an embodiment, in a same light emitting unit, the second carrier function layer in at least part of the first light emitting subunit, the second carrier function layer in at least part of the second light emitting subunit, and the second carrier function layer in at least part of the third light emitting subunit are continuously positioned.

In an embodiment, in a same light emitting unit, the first carrier function layer in at least part of the first light emitting subunit, the first carrier function layer in at least part of the second light emitting subunit, and the first carrier function layer in at least part of the third light emitting subunit are continuously positioned. Also, the second carrier function layer in at least part of the first light emitting subunit, the second carrier function layer in at least part of the second light emitting subunit, and the second carrier function layer in at least part of the third light emitting subunit are continuously positioned.

The present application further provides a display device including any one of the above display panels provided in the present application.

DETAILED DESCRIPTION

Figure 1:
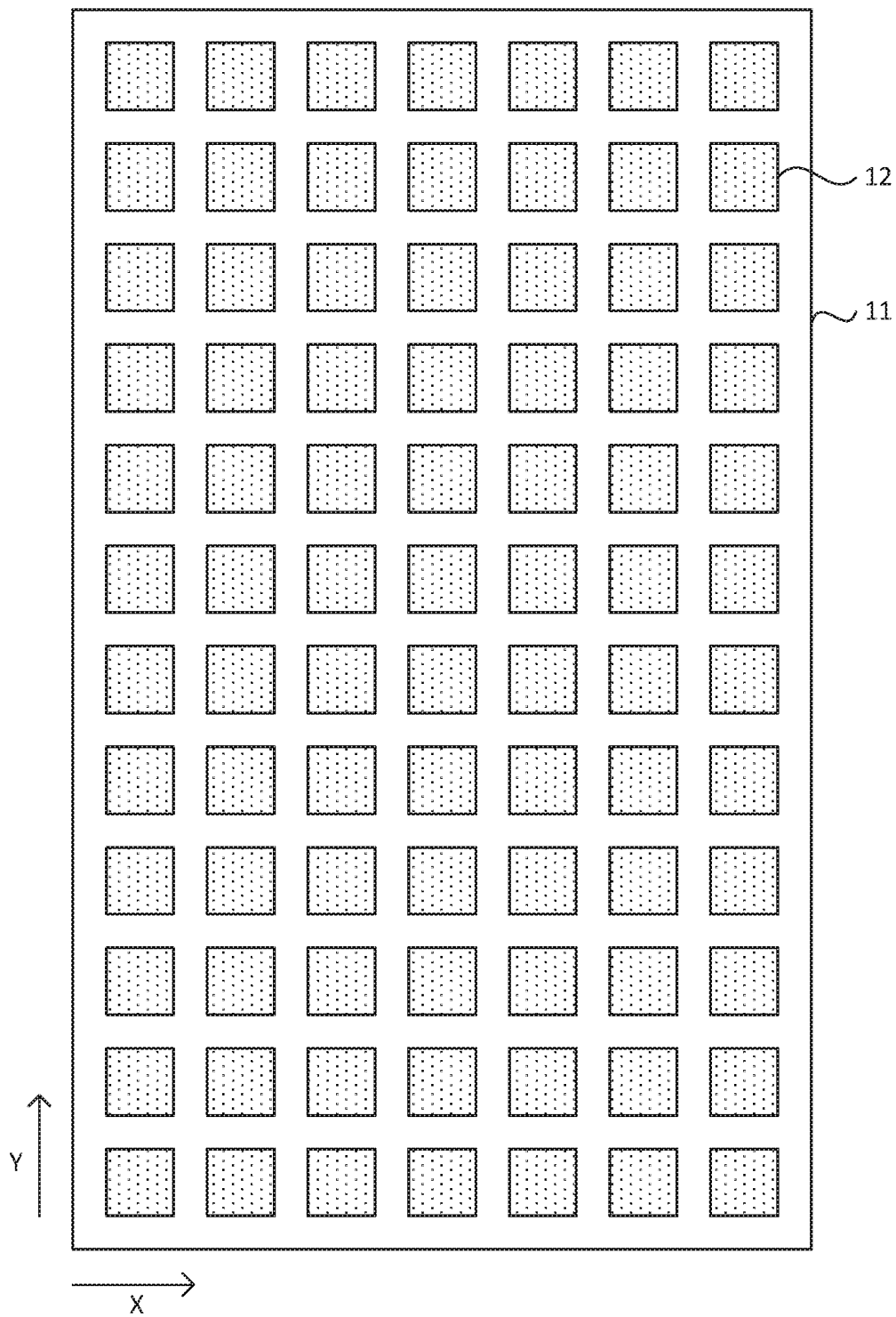
FIG. 1 is a schematic diagram of a display panel provided in an embodiment of the present application.

However, the existing organic light emitting diode (light emitting unit) has a low light emitting intensity, and an overall display brightness of the display panel and the display device, to which the light emitting unit is applied, is relatively low. The present application will now be described in further detail with reference to the accompanying drawings and embodiments below. The specific embodiments described herein are merely illustrative of the present application and are not intended to be limiting the present application. In addition, for convenience of description, only some but not all structures related to the present application are shown in the drawings.

Figure 2:
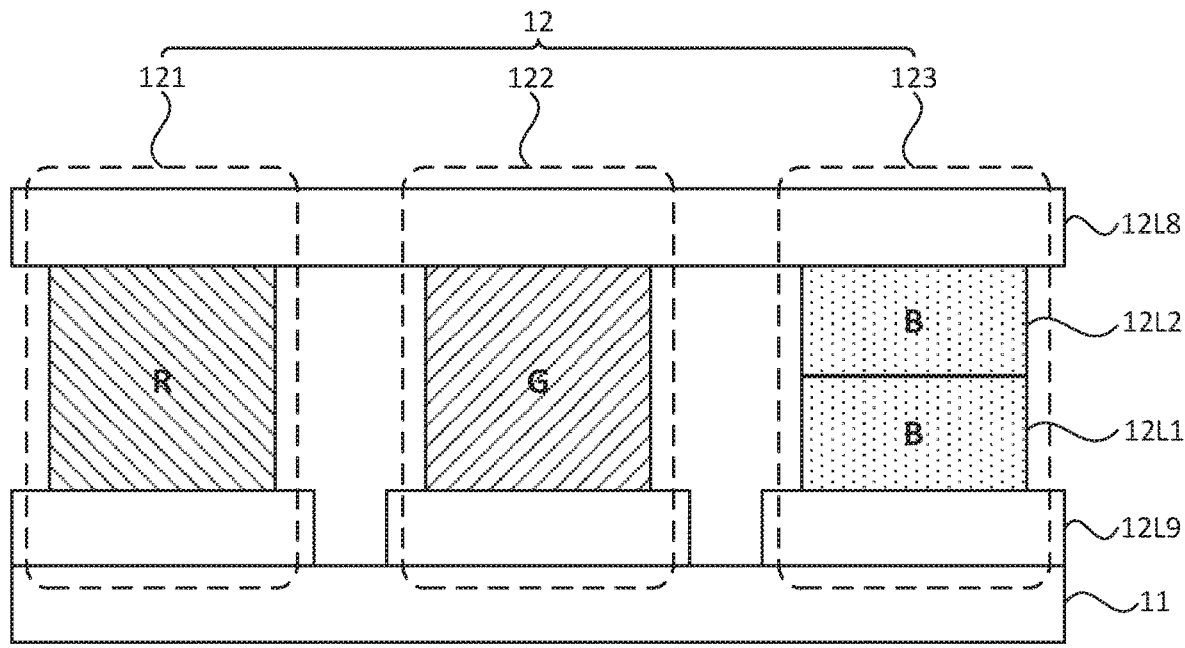
FIG. 2 is a schematic diagram of a light emitting unit provided in an embodiment of the present application.

In an embodiment, referring to FIGS. 1 and 2, the display panel 10 includes a substrate 11 and multiple light emitting units 12 positioned on one side of the substrate 11 and arranged in an array. Each of the light emitting units 12 includes a first light emitting subunit 121, a second light emitting subunit 122, and a third light emitting subunit 123. Each of the light emitting units 12 includes a first electrode 12L9 positioned close to the substrate 11, a second electrode 12L8 positioned opposite to the first electrode 12L9, and a second light emitting layer 12L2 positioned between the first electrode 12L9 and the second electrode 12L8. At least the third light emitting subunit 123 includes at least one first light emitting layer 12L1 (exemplarily, one first light emitting layer 12L1 is shown in FIG. 2), and the at least one first light emitting layer 12L1 is positioned between the second light emitting layer 12L2 and the first electrode 12L9.

In the embodiment of the present application, the substrate 11 may be a rigid substrate or a flexible substrate. Exemplarily, the rigid substrate may include glass or silicon, and the flexible substrate may include polyimide or stainless steel, which is merely an exemplary illustration and not limiting In other embodiments, the substrate 11 may be other substrates known to those skilled in the art, which is not limited in the embodiment of the present application.

In an embodiment, the first electrode 12L9 may be an anode. Exemplarily, the material of the first electrode 12L9 may be Indium Tin Oxide (ITO), fluorine-doped tin oxide (FTO), Indium Zinc Oxide (IZO), or other transparent conductive electrode materials with high conductivity and high escape work (the escape work is also called a work function or an out of work, and refers to work that must be done to overcome the surface barrier when the electron escapes) known to those skilled in the art, which is not limited in the embodiment of the present application.

In an embodiment, the second electrode 12L8 may be a cathode. Exemplarily, the material of the second electrode 12L8 may be a metal such as copper (Cu), aluminum (Al), gold (Au), silver (Ag), or a metal alloy, or other electrode materials with low escape work known to those skilled in the art, which is not limited in the embodiment of the present application.

The materials of the first light emitting layer 12L1 and the second light emitting layer 12L2 may be any materials known to those skilled in the art, which is not limited in the embodiment of the present application.

At least the third light emitting subunit 123 is configured to include at least one first light emitting layer 12L1 so that the third light emitting subunit 123 may be formed with a stacked light emitting structure, thereby increasing the light emitting intensity of the light emitting unit 12 and thus improving the display brightness of the display panel 10.

Figure 3:
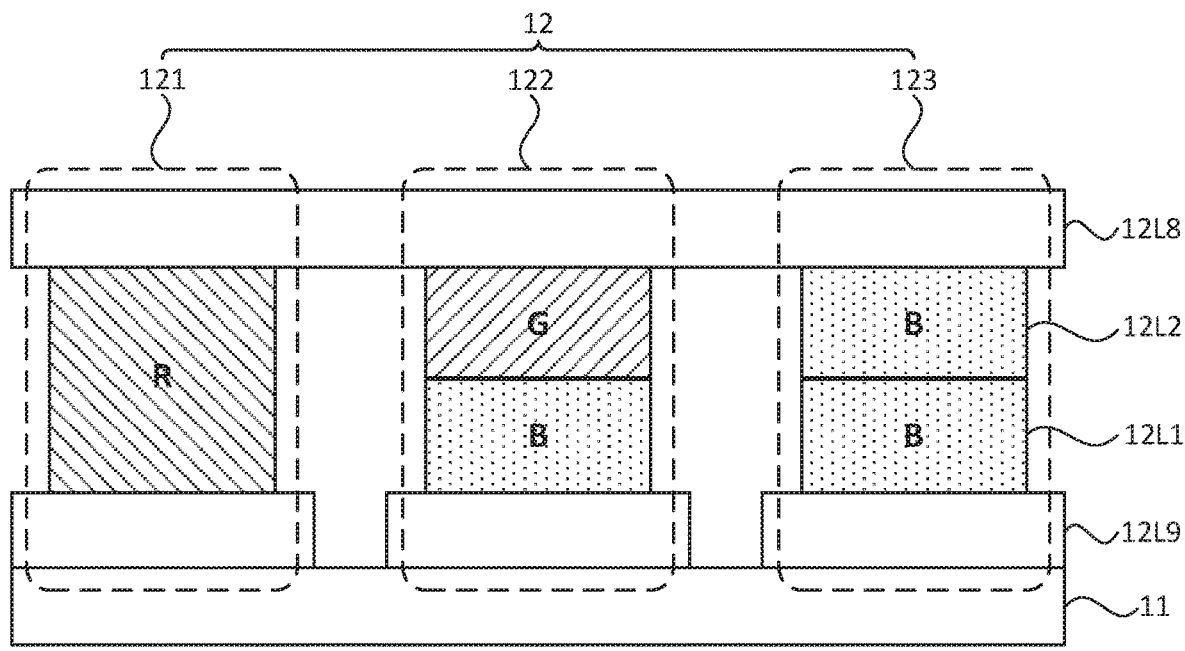
FIG. 3 is a schematic diagram of another light emitting unit provided in an embodiment of the present application.
Figure 4:
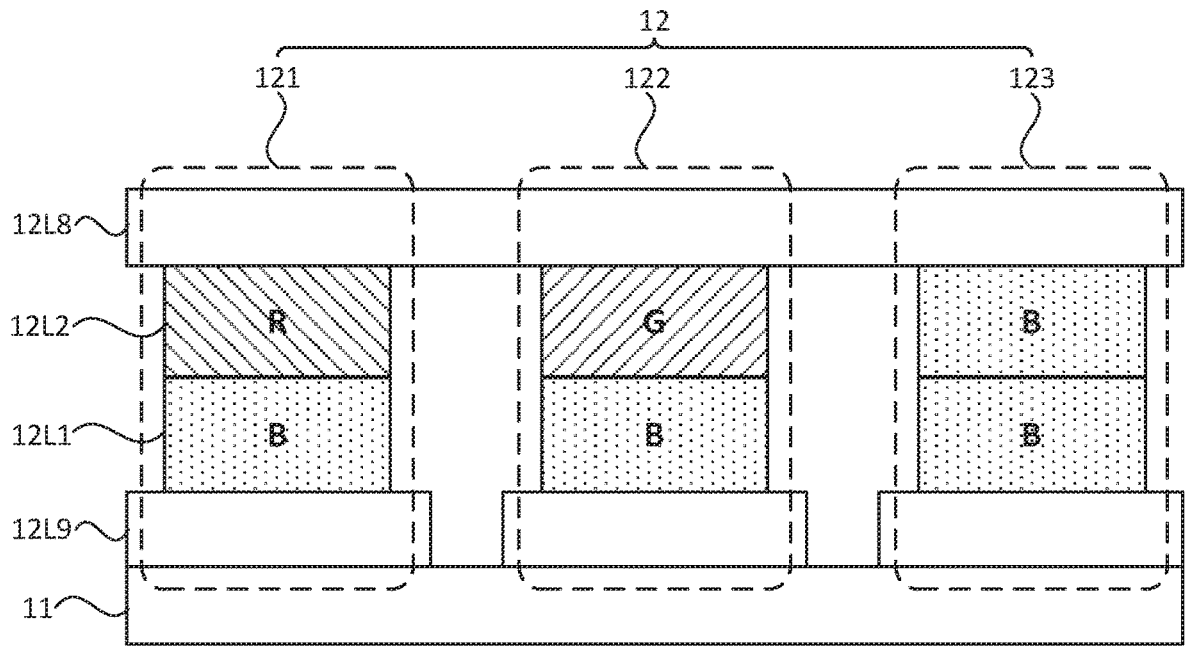
FIG. 4 is a schematic diagram of yet another light emitting unit provided in an embodiment of the present application.

In an embodiment, referring to FIGS. 3 and 4, at least one of the first light emitting subunit 121 or the second light emitting subunit 122 includes at least one first light emitting layer 12L1.

FIG. 3 exemplarily shows that the second light emitting subunit 122 and the third light emitting subunit 123 respectively include one first light emitting layer 12L1. Of course, it is also possible to configure the first light emitting subunit 121 and the third light emitting subunit 123 to include one first light emitting layer 12L1, respectively. FIG. 4 exemplarily shows that the first light emitting subunit 121, the second light emitting subunit 122 and the third light emitting subunit 123 include one first light emitting layer 12L1, respectively.

Of course, the number of the first light emitting layer 12L1 may be set according to the actual requirement of the display panel 10, which is not limited in the embodiment of the present application.

Two or three light emitting subunits in the light emitting unit 12 are respectively provided with at least one first light emitting layer 12L1, so that the light emitting intensity of the light emitting unit 12 may be further enhanced, thereby making the display brightness of the display panel 10 high.

In an embodiment, in the first light emitting subunit 121, a light emitting wavelength of the first light emitting layer 12L1 is less than a light emitting wavelength of the second light emitting layer 12L2, in the second light emitting subunit 122, a light emitting wavelength of the first light emitting layer 12L1 is less than a light emitting wavelength of the second light emitting layer 12L2, in the third light emitting subunit 123, a light emitting wavelength of the first light emitting layer 12L1 is less than or equal to a light emitting wavelength of the second light emitting layer 12L2.

With such arrangement, the light having a small wavelength (i.e., a high energy) and emitted from the first light emitting layer 12L1 may be used to excite the light emitting material of the second light emitting layer 12L2 to emit light.

Exemplarily, a wavelength range of the light emitting wavelength of the second light emitting layer 12L2 in the first light emitting subunit 121 may be 622 nm to 760 nm, a wavelength range of the light emitting wavelength of the second light emitting layer 12L2 in the second light emitting subunit 122 may be 492 nm to 577 nm, a wavelength range of the light emitting wavelength of the second light emitting layer 12L2 in the third light emitting subunit 123 may be 435 nm to 450 nm, a wavelength range of the light emitting wavelength of the first light emitting layer 12L1 in the third light emitting subunit 123 may be 435 nm to 450 nm. The above wavelength ranges are merely an exemplary illustration and not limiting. In other embodiments, the wavelength range of the light emitting wavelength in each light emitting subunit may be set according to the actual requirement of the display panel 10, which is not limited in the embodiment of the present application.

In an embodiment, a light emitting color of the first light emitting layer 12L1 is blue B; a light emitting color of the second light emitting layer 12L2 in the first light emitting subunit 121 is red R, a light emitting color of the second light emitting layer 12L2 in the second light emitting subunit 122 is green G, and a light emitting color of the second light emitting layer 12L2 in the third light emitting subunit 123 is blue B.

The light emitting color of the first light emitting layer 12L1 is blue B, and the light emitting color of the second light emitting layer 12L2 in the third light emitting subunit 123 is blue B. Both of the first light emitting layer 12L1 and the second light emitting layer 12L2 may be formed of a blue light host material doped with a blue light guest material. Exemplarily, the blue light guest material may be a fluorescent guest material (anthracene-based dopant) or a phosphorescent guest material (iridium-based ligand), which is merely an exemplary illustration and not limiting. In other embodiments, the first light emitting layer 12L1 may further include other materials known to those skilled in the art, which is not limited in the embodiment of the present application.

Further, since the light emitting layer whose light emitting color is blue requires the highest driving current on the premise of the same light emitting intensity, setting the light emitting color of the first light emitting layer 12L1 to be blue B leads to high light emitting intensity of the second light emitting layer 12L2 of the first light emitting subunit 121 and the second light emitting subunit 122, as well as low light emitting intensity of the first light emitting layer 12L1, thereby the influence of the first light emitting layer 12L1 on the light emitting chromaticity of the first light emitting subunit 121 and the second light emitting subunit 122 may be reduced. Thus, the light emitting intensity of the first light emitting subunit 121 and the second light emitting subunit 122 is enhanced without affecting the light emitting chromaticity of the first light emitting subunit 121 and the second light emitting subunit 122 (it may also be understood that the resulting color shift may not be resolved by the human eye, or the resulting color shift is within an acceptable range of product specifications).

The light emitting color of the second light emitting layer 12L2 in the first light emitting subunit 121 is red, which may be formed of a red light host material doped with a red light guest material. The light emitting color of the second light emitting layer 12L2 in the second light emitting subunit 122 is green, which may be formed of a green light host material doped with a green light guest material. Exemplarily, the red light host material, the red light guest material and the green light host material may be materials known to those skilled in the art, which will not described in detail and not limited in the embodiment of the present application. Where, based on the structure of the light emitting unit 12 shown in FIG. 4, for each light emitting subunit (exemplarily, may be the first light emitting subunit 121, the second light emitting subunit 122, or the third light emitting subunit 123), the light emitting intensity of each light emitting subunit is determined by the light superposition of the following three portions: a first portion, in which one second light emitting layer 12L2 emits the light based on an electroluminescence mechanism; a second portion, in which one first light emitting layer 12L2 each emits the light based on an electroluminescence mechanism, from which the light exits; third portion, in which the light emitted from the first light emitting layer 12L1 is irradiated onto the second light emitting layer 12L2, and the second light emitting layer 12L2 emits the light based on a photoluminescence mechanism. Thereby, the light emitting intensity of each light emitting subunit is enhanced.

For the third light emitting subunit 123 whose light emitting color is blue, the light emitting intensity of the third light emitting subunit 123 may include a superposition of the light emitting intensities of two blue light emitting layers (one first light emitting layer 12L1 and one second light emitting layer 12L2), and the intensity of light emitted from the second light emitting layer 12L2 based on the photoluminescence mechanism under the irradiation of light of the first light emitting layer 12L1. Thereby, the light emitting intensity of the third light emitting subunit 123 is significantly improved.

For the first light emitting subunit 121 or the second light emitting subunit 122, the light emitting intensity of the first light emitting subunit 121 or the second light emitting subunit 122 may include a superposition of the light emitting intensities of one first light emitting layer 12L1 and one respective second light emitting layer 12L2 (a red light emitting layer and a green light emitting layer, respectively), as well as the intensity of light emitted from the second light emitting layer 12L2 based on the photoluminescence mechanism under the irradiation of light of the first light emitting layer 12L1. Thereby, the light emitting intensities of the first light emitting subunit 121 and the second light emitting subunit 122 are improved.

Therefore, in the display panel 10 provided in the embodiment of the present application, the light emitting intensities of the first light emitting subunit 121, the second light emitting subunit 122, and the third light emitting subunit 123 are all improved, so that the light emitting intensity of the entire light emitting unit 12 may be improved, and thus the display brightness of the display panel 10 is improved.

Figure 5:
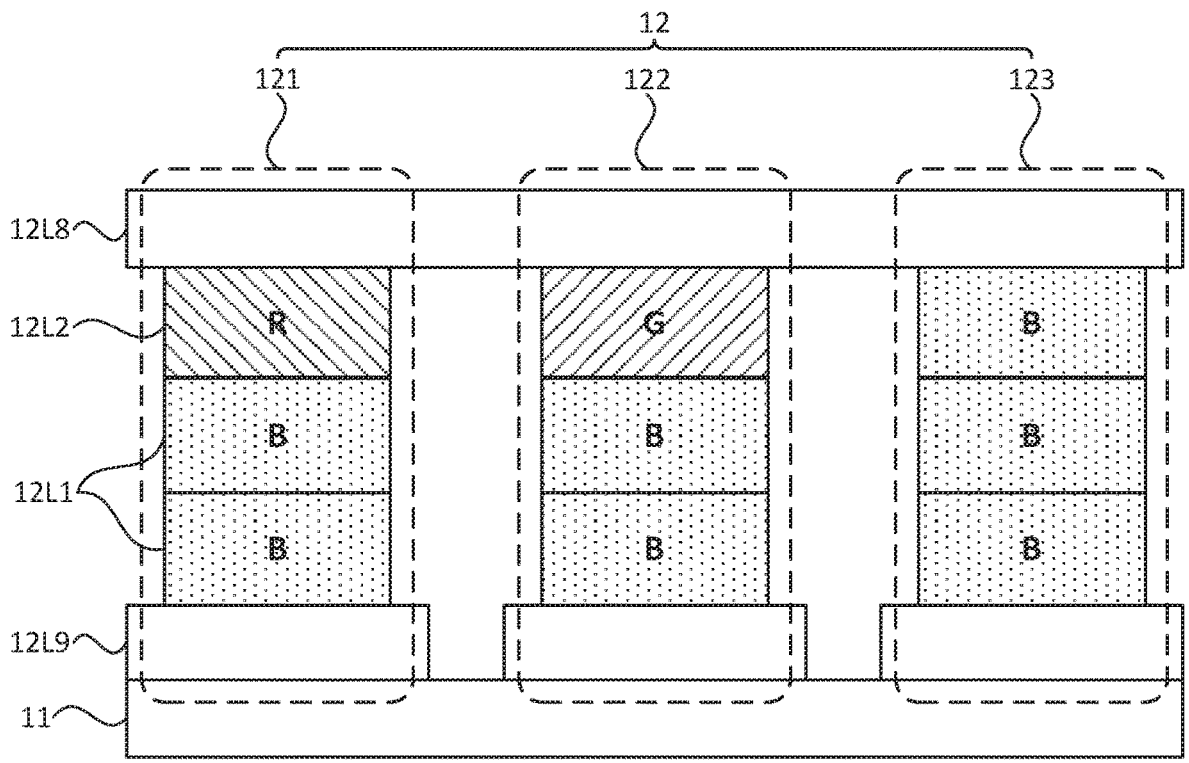
FIG. 5 is a schematic diagram of yet another light emitting unit provided in an embodiment of the present application.

In an embodiment, referring to FIG. 5, the light emitting unit 12 includes a first light emitting subunit 121, a second light emitting subunit 122, and a third light emitting subunit 123. Also, the light emitting unit 12 includes a first electrode 12L9 positioned close to the substrate 11, a second electrode 12L8 positioned opposite to the first electrode 12L9, and one second light emitting layer 12L2 and two first light emitting layers 12L1 positioned between the first electrode 12L9 and the second electrode 12L8. The two first light emitting layers 12L1 are positioned between the second light emitting layer 12L2 and the first electrode 12L9. The light emitting color of the first light emitting layer 12L1 is blue B. The light emitting color of the second light emitting layer 12L2 in the first light emitting subunit 121 is red R, the light emitting color of the second light emitting layer 12L2 in the second light emitting subunit 122 is green G, and the light emitting color of the second light emitting layer 12L2 in the third light emitting subunit 123 is blue B.

In the structure of the light emitting unit shown in FIG. 5, for the third light emitting subunit 123, the light emitting intensity of the third light emitting subunit 123 may include a superposition of the light emitting intensities of three blue light emitting layers (two first light emitting layers 12L1 and one second light emitting layer 12L2), as well as the intensity of light emitted from the second light emitting layer 12L2 based on the photoluminescence mechanism under the irradiation of light of the first light emitting layer 12L1. Thereby, the light emitting intensity of the third light emitting subunit 123 is significantly improved.

In the structure of the light emitting unit shown in FIG. 5, for the first light emitting subunit 121 or the second light emitting subunit 122, the light emitting intensity of the first light emitting subunit 121 or the second light emitting subunit 122 may include a superposition of the light emitting intensities of two first light emitting layer 12L1 and one respective second light emitting layer 12L2 (a red light emitting layer and a green light emitting layer, respectively), as well as the intensity of light emitted from the second light emitting layer 12L2 based on the photoluminescence mechanism under the irradiation of light of the first light emitting layer 12L1. Thereby, the light emitting intensities of the first light emitting subunit 121 and the second light emitting subunit 122 are improved.

Thereby, in this display panel 10, the light emitting intensities of the first light emitting subunit 121, the second light emitting subunit 122, and the third light emitting subunit 123 are all improved, so that the light emitting intensity of the entire light emitting unit 12 may be improved, and thus the display brightness of the display panel 10 is improved.

FIG. 1 exemplarily shows an X direction as a row direction and a Y direction as a column direction, and the multiple light emitting units 12 arranged in an array of 7 columns and 12 rows on one side of the substrate 11, which is merely an exemplary illustration and not a limitation of the display panel 10 provided in the embodiment of the present application. In other embodiments, the number of the light emitting units 12 and the arrangement manner of the array may be set according to the actual requirement of the display panel 10, which is not limited in the embodiment of the present application.

FIG. 5 only exemplarily shows that the number of the first light emitting layer 12L1 is two, and FIG. 4 only exemplarily shows that the number of the first light emitting layer 12L1 is one, which is merely an exemplary illustration and not a limitation of the display panel 10 provided in the present application. In other embodiments, the number of the first light emitting layer 12L1 may be set according to the actual requirement of the display panel 10, which is not limited in the embodiment of the present application.

Figure 6:
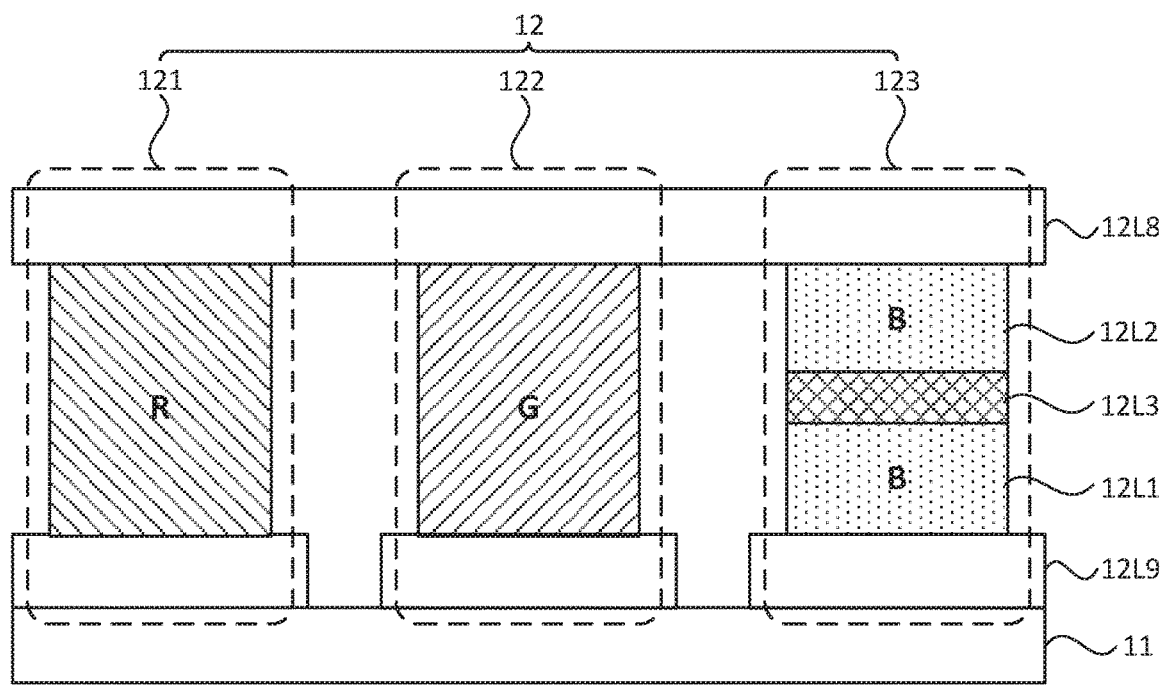
FIG. 6 is a schematic diagram of yet another light emitting unit provided in an embodiment of the present application.
Figure 7:
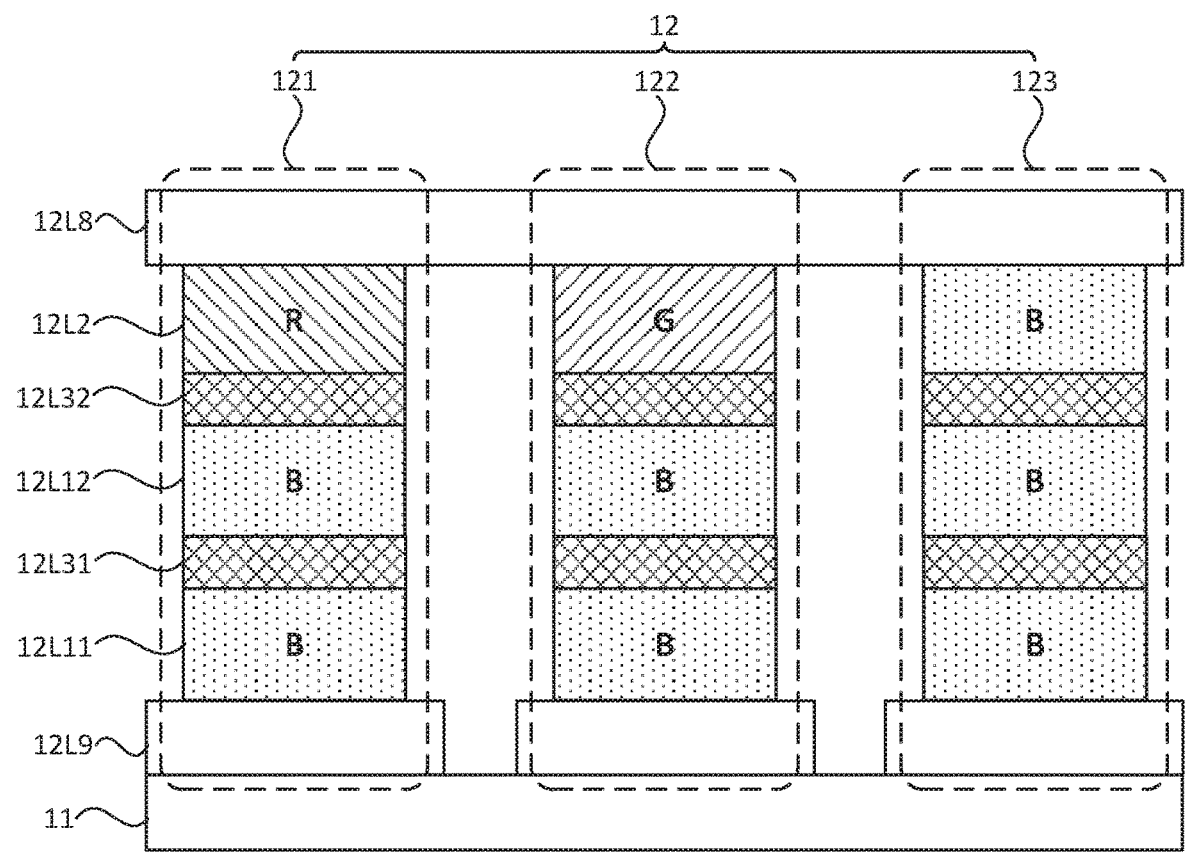
FIG. 7 is a schematic diagram of yet another light emitting unit provided in an embodiment of the present application.
Figure 8:
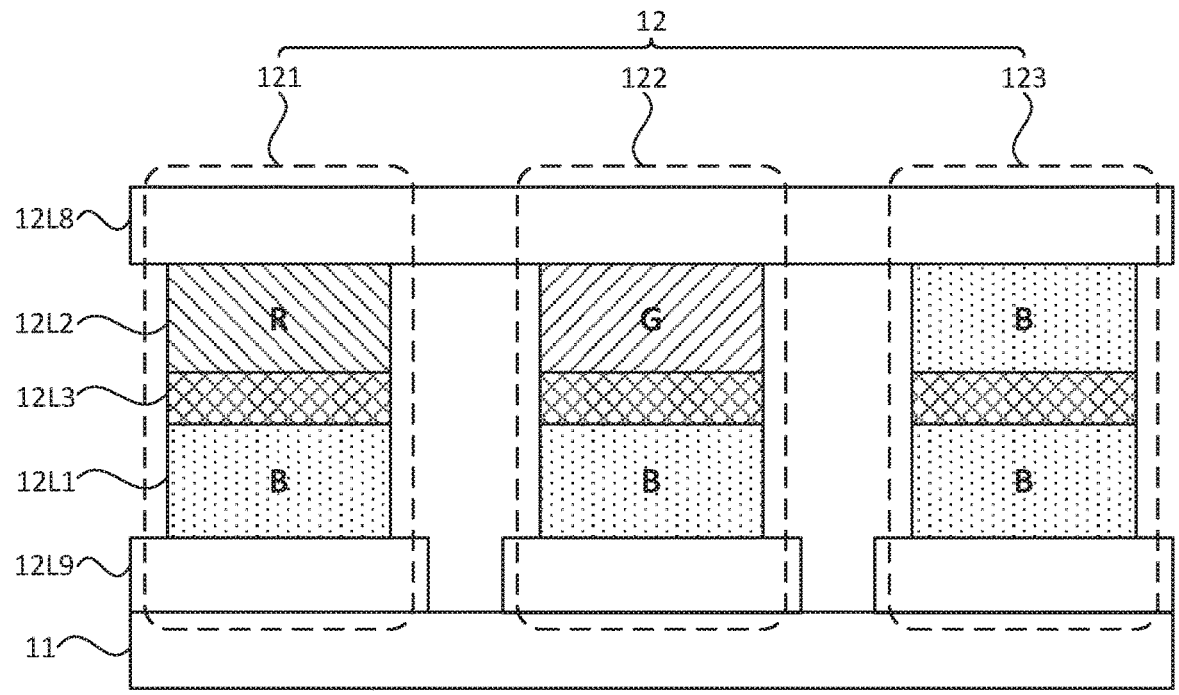
FIG. 8 is a schematic diagram of yet another light emitting unit provided in an embodiment of the present application.

In an embodiment, referring to FIGS. 6 to 8, the light emitting unit 12 further includes at least one charge generation layer 12L3, and the charge generation layer 12L3 is positioned between the first light emitting layer 12L1 and the second light emitting layer 12L2 adjacent to each other. When the number of the first light emitting layer 12L1 is at least two, the charge generation layer is also positioned between two adjacent first light emitting layers 12L1.

The charge generation layer 12L3 may generate electrons and holes, which are transported into the light emitting layer, and the electrons may recombine with the holes injected from the first electrode 12L9, or the holes may recombine with the electrons injected from the second electrode 12L8, thereby improving the light emitting intensity of the light emitting unit 12.

In an embodiment, referring to FIG. 6, in the light emitting unit 12 shown in FIG. 6, only the third light emitting subunit 123 includes one first light emitting layer 12L1. The charge generation layer 12L3 is positioned only in the third light emitting subunit 123, and the charge generation layer 12L3 is positioned between the first light emitting layer 12L1 and the second light emitting layer 12L2. Based on this, in the third light emitting subunit 123, the electrons and holes generated in the charge generation layer 12L3 are transported to the first light emitting layer 12L1 and the second light emitting layer 12L2, respectively. Thus, in the first light emitting layer 12L1 of the third light emitting subunit 123, the holes injected from the first electrode 12L9 may also recombine with the electrons injected from the charge generation layer 12132 in the second light emitting layer 12L2 of the third light emitting subunit 123, the electrons injected from the second electrode 12L8 may also recombine with the holes injected from the charge generation layer 1213, thereby the recombination efficiency of the electrons and holes in the first light emitting layer 12L1 and the second light emitting layer 12L2 is increased, the utilization rate of the holes injected from the first electrode 12L9 into the first light emitting layer 12L1 is also increased, as well as the utilization rate of the electrons injected from the second electrode 12L8 into the second light emitting layer 12L2 is increased, thereby increasing the light emitting intensity of the third light emitting subunit 123, and further increasing the light emitting intensity of the light emitting unit 12 as a whole.

In an embodiment, referring to FIG. 7, the light emitting unit 12 includes two first light emitting layers, i.e., a first light emitting sublayer 12L11 positioned adjacent to the first electrode 12L9 and a second light emitting sublayer 12L12 positioned adjacent to the second electrode 12L8. Also, the light emitting unit 12 includes two charge generation layers, i.e., a first charge generation layer 12L31 and a second charge generation layer 12L32. The first charge generation layer 12L31 is positioned between the first light emitting sublayer 12L11 and the second light emitting sublayer 12L12, and the second charge generation layer 12132 is positioned between the second light emitting sublayer 12L12 and the second light emitting layer 12L2. Based on this, electrons and holes generated in the first charge generation layer 12L31 are transported to the first light emitting sublayer 12L11 and the second light emitting sublayer 12L12, respectively, electrons and holes generated in the second charge generation layer 12L32 are transported to the second light emitting sublayer 12L12 and the second light emitting layer 12L2, respectively. Thus, in the first light emitting sublayer 12L11, the holes injected from the first electrode 12L9 may also recombine with the electrons injected from the first charge generation layer 12L31; in the second light emitting sublayer 12L12, the holes injected from the first charge generation layer 12L31 may also recombine with the electrons injected from the second charge generation layer 12L32; in the second light emitting layer 12L2, the electrons injected from the second electrode 12L8 may also recombine with the holes injected from the second charge generation layer 12L32. The recombination efficiency of electrons and holes in the light emitting layer (including the first light emitting sublayer 12L11, the second light emitting sublayer 12L12, and the second light emitting layer 12L2) may be increased by means of electrons and holes generated from the first charge generation layer 12L31 and the second charge generation layer 12L32, so that the light emitting intensity of the light emitting unit 12 may be improved.

In an embodiment, referring to FIG. 8, three light emitting subunits of the light emitting unit 12 each include one first light emitting layer 12L1, one second light emitting layer 12L2 and one charge generating layer 12L3, where the charge generating layer 12L3 is positioned between the first light emitting layer 12L1 and the second light emitting layer 12L2. Based on this, in each light emitting subunit, the electrons and holes generated in the charge generation layer 12L3 are transported to the first light emitting layer 12L1 and the second light emitting layer 12L2, respectively. Thus, in the first light emitting layer 12L1, the holes injected from the first electrode 12L9 may also recombine with the electrons injected from the charge generation layer 12L3; in the second light emitting layer 12L2, the electrons injected from the second electrode 12L8 may also recombine with the holes injected from the charge generation layer 12L3, thereby the recombination efficiency of the electrons and holes in the first light emitting layer 12L1 and the second light emitting layer 12L2 is increased, and the utilization rate of the holes injected from the first electrode 12L9 into the first light emitting layer 12L1 is also increased, as well as the utilization rate of the electrons injected from the second electrode 12L8 into the second light emitting layer 12L2 is increased, and thus the light emitting intensity of the light emitting unit 12 may be increased.

In an embodiment, the charge generation layer 12L3 includes a P-type semiconductor layer and an N-type semiconductor layer.

The P-type semiconductor layer may provide holes to the light emitting layer immediately adjacent to the P-type semiconductor layer and close to the side of the second electrode 12L8, and block the electrons in the light emitting layer from being transported to the side of the first electrode 12L8. The N-type semiconductor layer may supply electrons to the light emitting layer adjacent to the N-type semiconductor layer and close to the side of the first electrode 12L9 and block transport of holes in this light emitting layer from being transported to the side of the second electrode 12L9.

Exemplarily, materials for the charge generation layer 12L3 may contain Alq3: mg/m-MTDATA:F4-TCNQ, Liq/Al/MoO3, Alq3:Li/NPB:FeCl3, or other charge generation layer materials known to those skilled in the art, which is not limited in the embodiment of the present application.

In other embodiments, the type of the charge generation layer 12L3 may further include an N-type semiconductor layer/metal oxide, an N-type semiconductor layer/organic, an undoped type, or other types of the charge generation layer 123 known to those skilled in the art, which is not limited in the embodiment of the present application.

In an embodiment, the charge generation layer 12L3 has a thickness A satisfying: 10 nm≤A≤30 nm.

With such arrangement, more electrons and holes may be longitudinally transported (in a direction perpendicular to a plane on which the substrate 11 is positioned), and transverse current leakage (in a direction parallel to the plane on which the substrate 11 is positioned) may be reduced, so that more electrons and holes are significantly recombined, and the light emitting intensity of the light emitting unit 12 is improved.

In an embodiment, with continued reference to FIG. 7 or FIG. 8, in a same light emitting unit 12, the charge generation layer 12L3 in the first light emitting subunit 121 (exemplarily, shown as the first charge generation layer 12L31 and the second charge generation layer 12L32 in FIG. 7), the charge generation layer 12L3 in the second light emitting subunit 122, and the charge generation layer 12L3 in the third light emitting subunit 123 are separately positioned.

With such arrangement, carriers may be avoided from being transported to each other among the first light emitting subunit 121, the second light emitting subunit 122 and the third light emitting subunit 123, so that different light emitting subunits (including the first light emitting subunit 121, the second light emitting subunit 122 and the third light emitting subunit 123) may be avoided from being influenced by each other when different driving currents are supplied by the first light emitting subunit 121, the second light emitting subunit 122, and the third light emitting subunit 123 in the same light emitting unit 12. Therefore, it is convenient to achieve precise control of the light emitting intensities and the light emitting colors of the first light emitting subunit 121, the second light emitting subunit 122 and the third light emitting subunit 123.

In an embodiment of the present application, the carriers include electrons, holes, or excitons.

Figure 9:
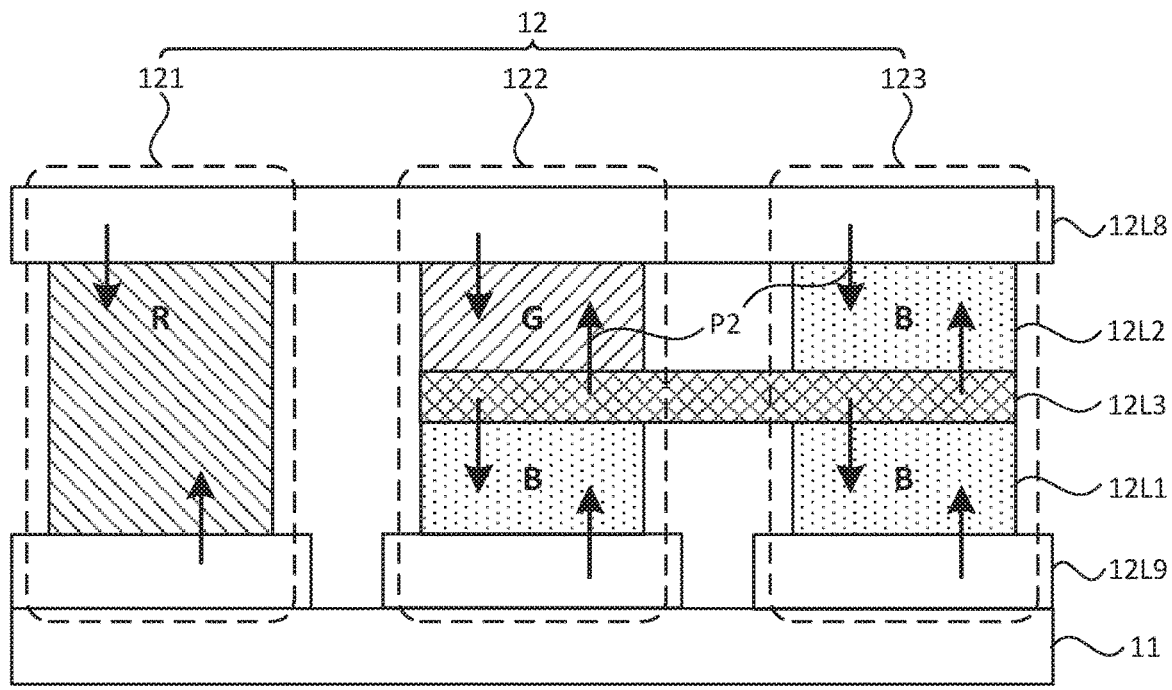
FIG. 9 is a schematic diagram of yet another light emitting unit provided in an embodiment of the present application.
Figure 10:
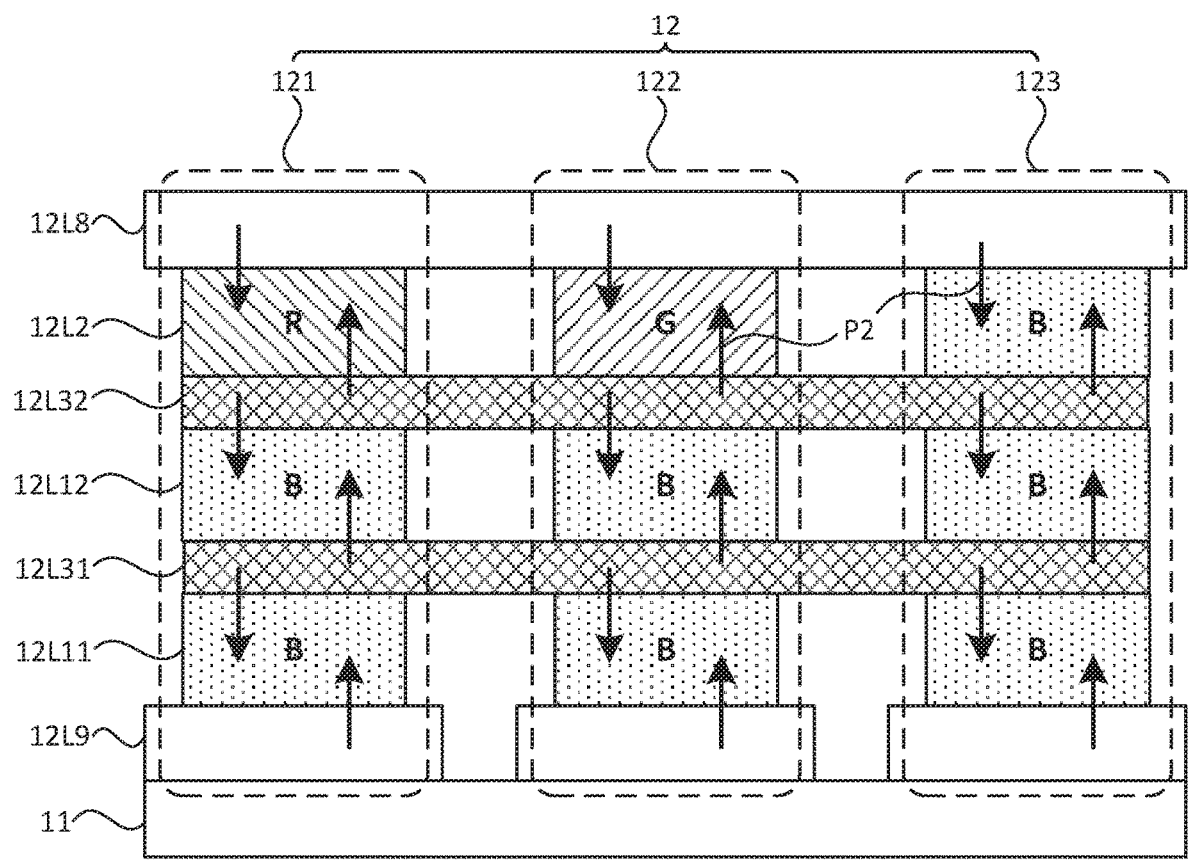
FIG. 10 is a schematic diagram of yet another light emitting unit provided in an embodiment of the present application.
Figure 11:
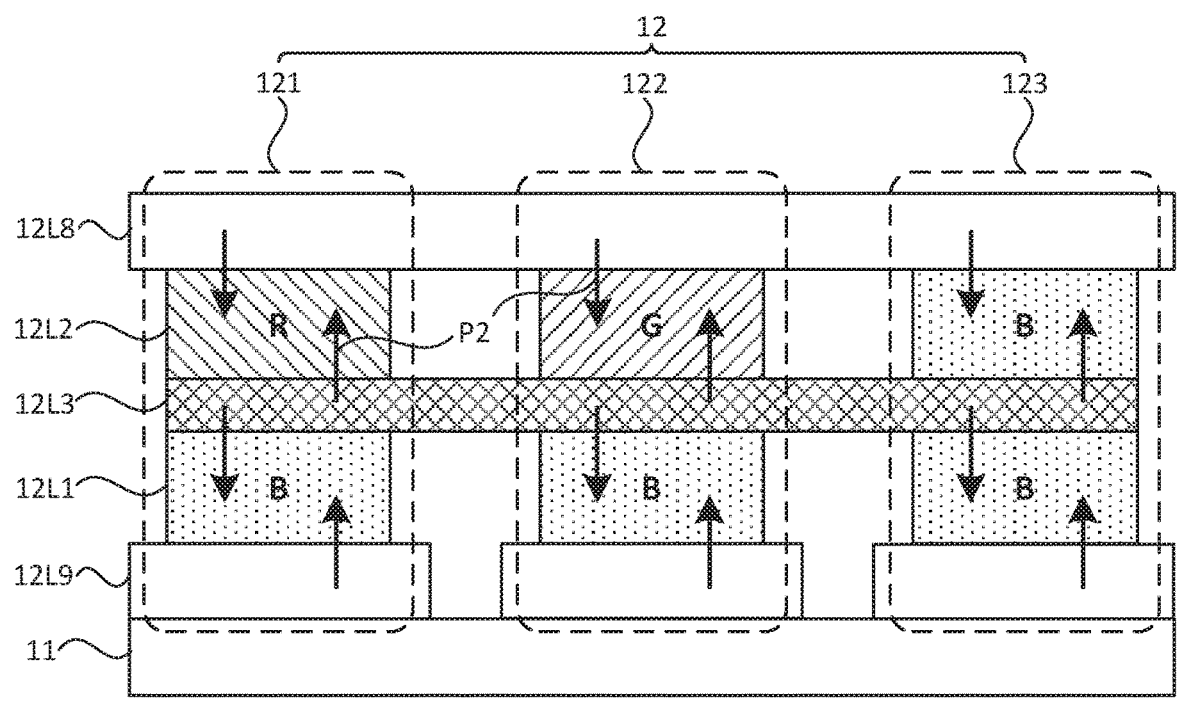
FIG. 11 is a schematic diagram of yet another light emitting unit provided in an embodiment of the present application.

In an embodiment, referring to FIGS. 9 to 11, in a same light emitting unit 12, the charge generation layer 12L3 in the first light emitting subunit 121 (exemplarily, shown as a first charge generation layer 12L31 and a second charge generation layer 12L32 in FIG. 10), the charge generation layer 12L3 in the second light emitting subunit 122, and the charge generation layer 12L3 in the third light emitting subunit 123 are continuously positioned.

FIG. 10 exemplarily shows a transport path (exemplarily, may include a longitudinal transport path P2) of carriers when the light emitting unit 12 includes two first light emitting layers (exemplarily, shown as the first light emitting sublayer 12L11 and the second light emitting sublayer 12L12 in FIG. 10), FIG. 11 exemplarily shows a transport path of carriers (exemplarily, may also include a longitudinal transport path P2) when the light emitting unit 12 includes one the first light emitting layer 12L1.

When a certain voltage is applied to the first electrode 12L9 and the second electrode 12L8, electrons and holes are generated in the charge generation layer 12L3 (exemplarily, shown as a first charge generation layer 12L31 and a second charge generation layer 12L32 in FIG. 10), where the electrons, holes and excitons (the electrons and the holes are recombined to form the excitons) are generally transported along the longitudinal transport path P2, and only a extremely small number of carriers are transported laterally. Therefore, the light emitting intensity of the light emitting subunits (including the first light emitting subunit 121, the second light emitting subunit 122, and the third light emitting subunit 123) due to the lateral transportation of the carriers in the charge generation layer 12L3 is negligible, and the image display effect of the display panel is not affected.

Moreover, the charge generation layers 12L3 (exemplarily shown as the first charge generation layer 12L31 and the second charge generation layer 12L32 in FIG. 10) of the light emitting subunits (including the first light emitting subunit 121, the second light emitting subunit 122 and the third light emitting subunit 123) in the same light emitting unit 12 are continuously positioned, so that an opening of a mask corresponding to the charge generation layer 12L3 may be increased, the design difficulty of the mask may be reduced, and meanwhile, the manufacturing difficulty of the charge generation layer 12L3 may be reduced, and the yield of the product (including the light emitting unit, the display panel and the applied display device) may be improved.

FIG. 9 only exemplarily shows that the second light emitting subunit 122 and the third light emitting subunit 123 include respective charge generation layers, and the charge generation layers are the same layer, i.e., the charge generation layers are continuously positioned, which is merely an exemplary illustration and not limiting. In other embodiments, it is also possible to configure the first light emitting subunit 121 and the third light emitting subunit 123 to include respective charge generation layers and configure these charge generation layer to be continuously positioned according to actual requirement of the display panel, which is not limited in the embodiment of the present application.

In addition, FIG. 10 only exemplarily shows that the number of the charge generation layers is two, and FIG. 11 only exemplarily shows that the number of the charge generation layers is one, and the charge generation layers of the multiple light emitting subunits in the same light emitting unit are all continuously positioned, which is merely an exemplary illustration and not limiting. In other embodiments, it is possible to configure the number of the charge generation layer and configure the charge generation layers in the same light emitting unit to be continuously or separately positioned according to the actual requirement of the display panel, which is not limited in the embodiments of the present application.

In an embodiment, the light emitting unit 12 further includes a first carrier function layer and a second carrier function layer. The first carrier function layer is at least positioned between the first electrode 12L9 and the first light emitting layer 12L1. The second carrier function layer is at least positioned between the second electrode 12L8 and the second light emitting layer 12L2.

In an embodiment, the first carrier function layer is positioned between the first electrode 12L9 and the first light emitting sublayer immediately adjacent to the first electrode 12L9, and positioned between the second light emitting sublayer and the charge generation layer immediately adjacent to the second light emitting sublayer and close to the first electrode 12L9, and positioned between the second light emitting layer 12L2 and the charge generation layer immediately adjacent to the second light emitting layer 12L2. The second carrier function layer is positioned between the second electrode 12L8 and the second light emitting layer 12L2, and positioned between the first light emitting layer and a charge generation layer immediately adjacent to the first light emitting layer and close to the second electrode 12L8.

Figure 12:
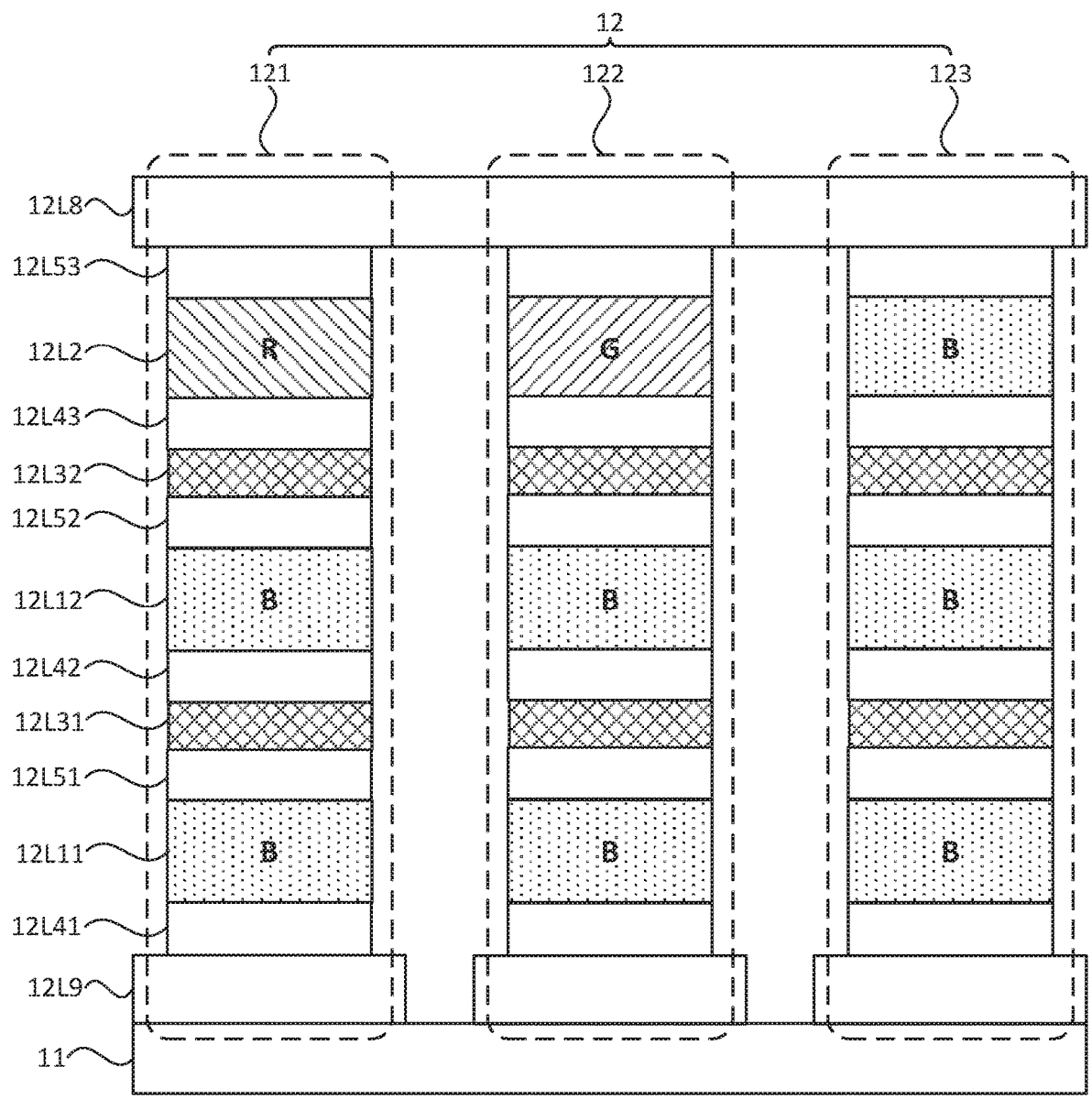
FIG. 12 is a schematic diagram of yet another light emitting unit provided in an embodiment of the present application.

Referring to FIG. 12, the first carrier function layer includes a first hole auxiliary function layer 12L41, a second hole auxiliary function layer 12L42 and a third hole auxiliary function layer 12L43. The first hole auxiliary function layer 12L41 is positioned between the first electrode 12L9 and the first light emitting sublayer 12L11. The second hole auxiliary function layer 12L42 is positioned between the second light emitting sublayer 12L12 and the first charge generation layer 12L31. The third hole auxiliary function layer 12L43 is positioned between the second light emitting layer 12L2 and the second charge generation layer 12L32.

With continued reference to FIG. 12, the second carrier function layer includes a first electron auxiliary function layer 12L51, a second electron auxiliary function layer 12L52 and a third electron auxiliary function layer 12L53. The first electron auxiliary function layer 12L51 is positioned between the first light emitting sublayer 12L11 and the first charge generation layer 12L31. The second electron auxiliary function layer 12L52 is positioned between the second light emitting sublayer 12L12 and the second charge generation layer 12L32. The third electron auxiliary function layer 12L53 is positioned between the second electrode 12L8 and the second light emitting layer 12L2.

The first carrier function layer may be a hole-type auxiliary function layer and have a multi-layer structure. For example, the first carrier function layer includes a hole injection layer, a hole transport layer and an electron blocking layer. The second carrier function layer may be an electron-type auxiliary function layer and have a multi-layer structure. For example, the second carrier function layer includes an electron injection layer, an electron transport layer and a hole blocking layer.

The first carrier function layer and the second carrier function layer may both include a carrier function layer material known to those skilled in the art, which will not described in detail and not limited in the embodiment of the present application. The forming modes of the first carrier function layer and the second carrier function layer may include evaporation, spraying, inkjet printing, or other film forming modes known to those skilled in the art, and the forming modes of the two layers may be the same or different, which is not limited in the embodiment of the present application.

Figure 13:
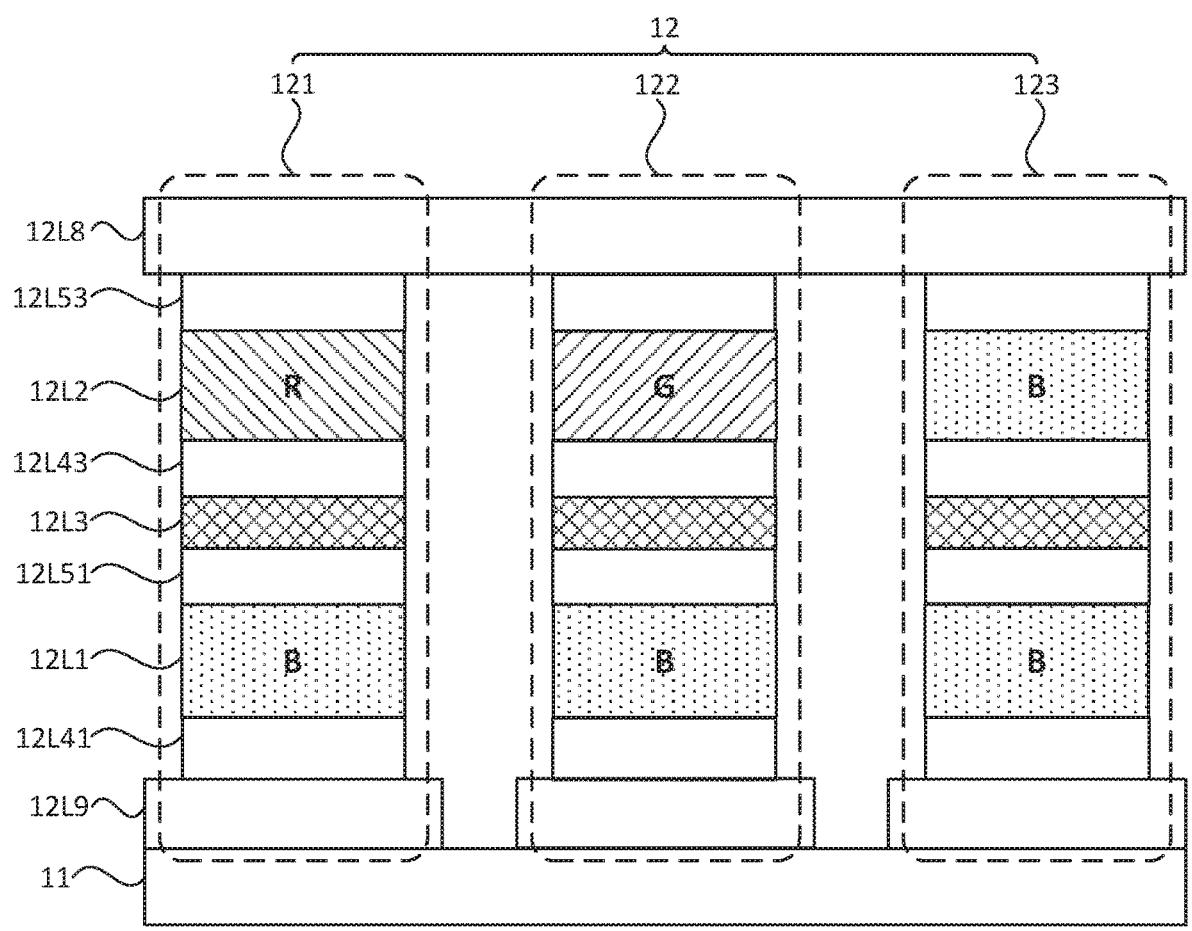
FIG. 13 is a schematic diagram of yet another light emitting unit provided in an embodiment of the present application.

In an embodiment, referring to FIG. 13, the light emitting unit includes two first carrier function layers (exemplarily shown as the first hole auxiliary function layer 12L41 and the third hole auxiliary function layer 12L43) and two second carrier function layers (exemplarily shown as the first electron auxiliary function layer 12L51 and the third electron auxiliary function layer 12L53). The first hole auxiliary function layer 12L41 is positioned between the first electrode 12L9 and the first light emitting layer 12L1, the first electron auxiliary function layer 12L51 is positioned between the first light emitting layer 12L1 and the charge generation layer 12L3, the third hole auxiliary function layer 12L43 is positioned between the charge generation layer 12L3 and the second light emitting layer 12L2, and the third electron auxiliary function layer 12L53 is positioned between the second light emitting layer 12L2 and the second electrode 12L8. Based on this, the first hole auxiliary function layer 12L41 transports holes from the first electrode 12L9 to the first light emitting layer 12L1, and blocks transport of electrons from the first light emitting layer 12L1 to the first electrode 12L9; the first electron auxiliary function layer 12L51 transports electrons from the charge generation layer 12L3 to the first light emitting layer 12L1, and blocks transport of holes from the first light emitting layer 12L1 to the charge generation layer 12L3. Thereby, the electrons and holes transported to the first light emitting layer 12L1 are confined in the first light emitting layer 12L1, the number of electrons and holes are increased, the recombination efficiency thereof is increased, and thus the light emitting intensity of the first light emitting layer 12L1 is improved. The third hole auxiliary function layer 12L43 transports holes from the charge generation layer 12L3 to the second light emitting layer 12L2, and blocks transport of electrons from the second light emitting layer 12L2 to the charge generation layer 12L3, the third electron auxiliary function layer 12L53 transports electrons from the second electrode 12L8 to the second light emitting layer 12L2 and blocks transport of holes from the second light emitting layer 12L2 to the second electrode 12L8. Thereby, the electrons and holes transported to the second light emitting layer 12L2 are confined in the second light emitting layer 12L2, the number of electrons and holes are increased, the recombination efficiency thereof is increased, and thus the light emitting intensity of the second light emitting layer 12L2 is improved. Since the light emitting intensities of both the first light emitting layer 12L1 and the second light emitting layer 12L2 are increased, the light emitting intensity of the light emitting unit 12 as a whole is increased.

In an embodiment, with continued reference to FIG. 12 or FIG. 13, in a same light emitting unit 12, the first carrier function layer (exemplarily, may include the first hole auxiliary function layer 12L41, the second hole auxiliary function layer 12L42, or the third hole auxiliary function layer 12L43) in the first light emitting subunit 121, the first carrier function layer in the second light emitting subunit 122, and the first carrier function layer in the third light emitting subunit 123 are separately positioned. In a same light emitting unit 12, the second carrier function layer (exemplarily, may include the first electron auxiliary function layer 12L51, the second electron auxiliary function layer 12L52, and the third electron auxiliary function layer 12L53) in the first light emitting subunit 121, the second carrier function layer in the second light emitting subunit 122 and the second carrier function layer in the third light emitting subunit 123 are separately provided.

Such arrangement avoids transport of carriers among the first light emitting subunit 121, the second light emitting subunit 122 and the third light emitting subunit 123, so that mutual influence among different light emitting subunits (including the first light emitting subunit 121, the second light emitting subunit 122, and the third light emitting subunit 123) may be avoided when different driving currents are supplied to the first light emitting subunit 121, the second light emitting subunit 122, and the third light emitting subunit 123 in the same light emitting unit 12. Therefore, it is convenient to achieve precise control of the light emitting intensities and the light emitting colors of the first light emitting subunit 121, the second light emitting subunit 122 and the third light emitting subunit 123.

In an embodiment, in a same light emitting unit 12, the first carrier function layer in at least part of the first light emitting subunit 121, the first carrier function layer in at least part of the second light emitting subunit 122, and the first carrier function layer in at least part of the third light emitting subunit 123 are continuously positioned.

In an embodiment, in a same light emitting unit, the second carrier function layer in at least part of the first light emitting subunit 121, the second carrier function layer in at least part of the second light emitting subunit 122, and the second carrier function layer in at least part of the third light emitting subunit 123 are continuously positioned.

In an embodiment, in a same light emitting unit 12, the first carrier function layer in at least part of the first light emitting subunit 121, the first carrier function layer in at least part of the second light emitting subunit 122, and the first carrier function layer in at least part of the third light emitting subunit 123 are continuously positioned. Also, the second carrier function layer in at least part of the first light emitting subunit 121, the second carrier function layer in at least part of the second light emitting subunit 122, and the second carrier function layer in at least part of the third light emitting subunit 123 are continuously positioned.

Figure 14:
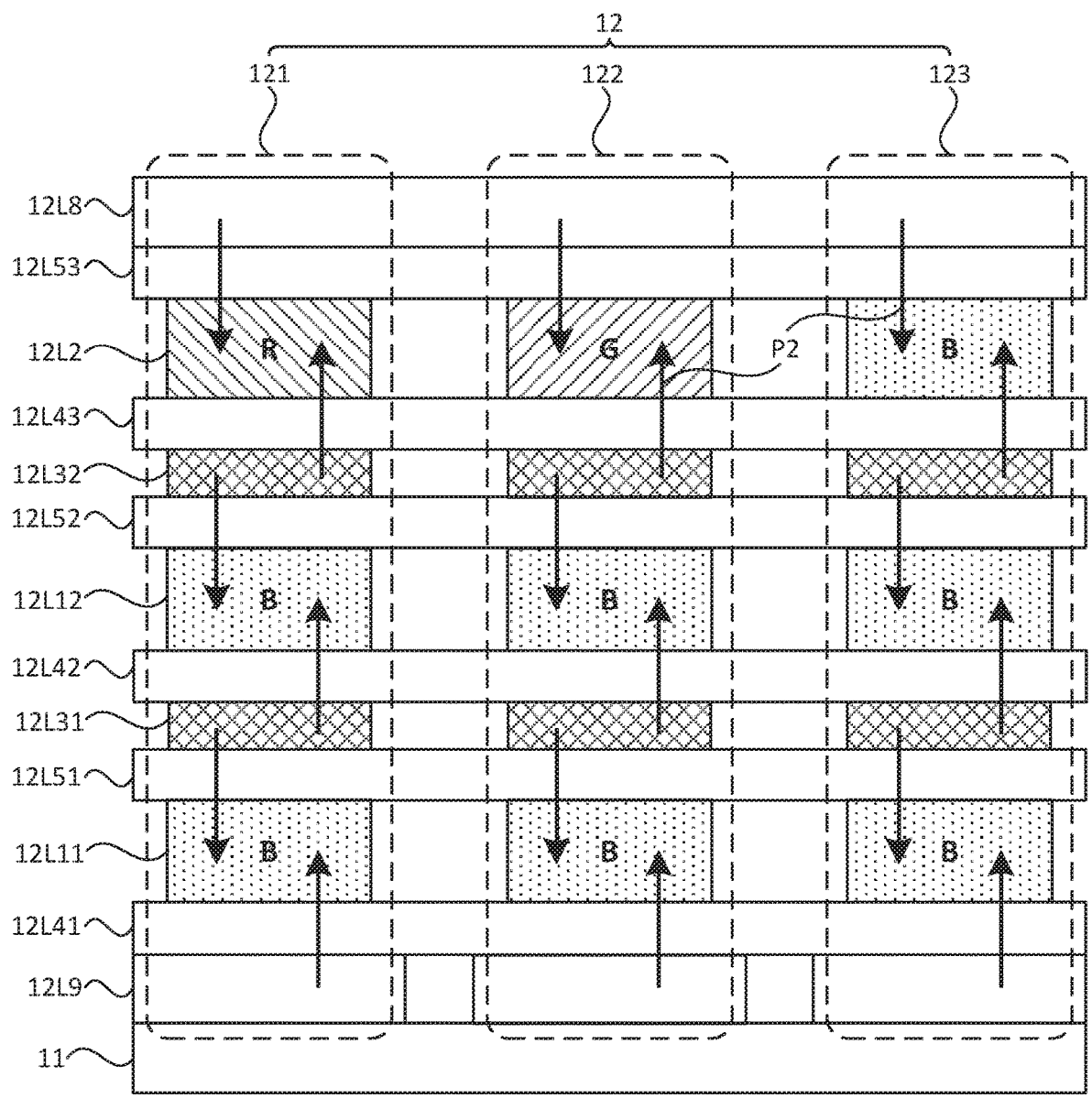
FIG. 14 is a schematic diagram of yet another light emitting unit provided in an embodiment of the present application.
Figure 15:
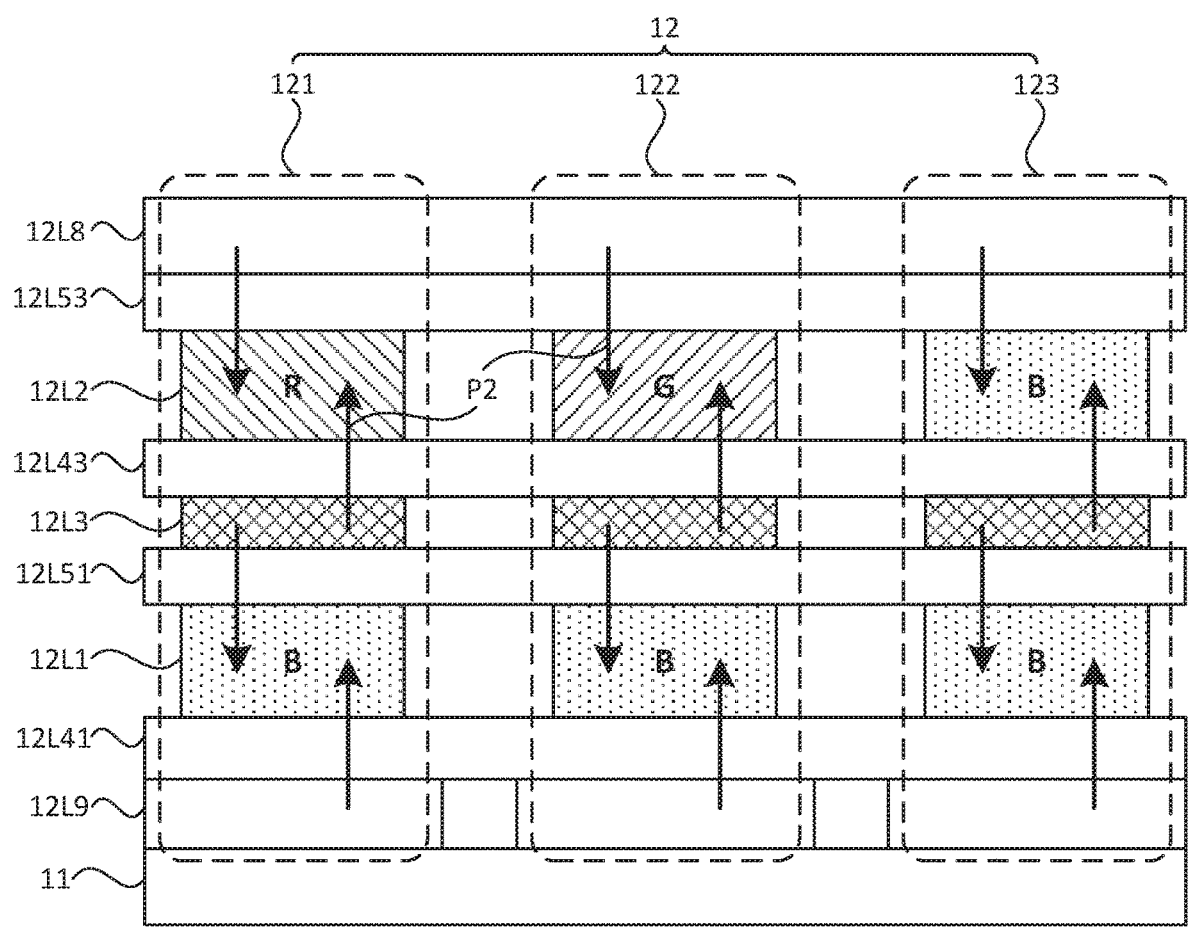
FIG. 15 is a schematic diagram of yet another light emitting unit provided in an embodiment of the present application.

In an embodiment, referring to FIGS. 14 and 15, in a same light emitting unit 12, the first carrier function layer (exemplarily, may include the first hole auxiliary function layer 12L41, the second hole auxiliary function layer 12L42 and the third hole auxiliary function layer 12L43) in the first light emitting subunit 121, the first carrier function layer in the second light emitting subunit 122, and the first carrier function layer in the third light emitting subunit 123 are continuously positioned. Meanwhile, the second carrier function layer (exemplarily, may include the first electron auxiliary function layer 12L51, the second electron auxiliary function layer 12L52, and the third electron auxiliary function layer 12L53) in the first light emitting subunit 121, the second carrier function layer in the second light emitting subunit 122, and the second carrier function layer in the third light emitting subunit 123 are continuously positioned.

Carriers tend to be transported along a path of least resistance. Since the lateral resistance of the first carrier function layer is much greater than its own longitudinal resistance and the lateral resistance of the second carrier function layer is also much greater than its own longitudinal resistance, carriers tend to be transported along the longitudinal transport path P2 rather than in a lateral direction for the first carrier function layer and the second carrier function layer. Therefore, for the multiple light emitting subunits (including the first light emitting subunit 121, the second light emitting subunit 122 and the third light emitting subunit 123) in the same light emitting unit 12 are continuously positioned, or the second carrier function layers, the first carrier function layers are continuously positioned, or the first carrier function layers and the second carrier function layers are continuously positioned respectively, without affecting the light emitting intensity and the light emitting color of the light emitting unit.

Moreover, the first carrier function layers of the multiple light emitting subunits (including the first light emitting subunit 121, the second light emitting subunit 122 and the third light emitting subunit 123) in the same light emitting unit 12 are continuously positioned, and the area of an opening of a mask corresponding to the first carrier function layer may also be increased. Similarly, the second carrier function layers of the multiple light emitting subunits (including the first light emitting subunit 121, the second light emitting subunit 122, and the third light emitting subunit 123) are continuously positioned, and the area of an opening of a mask corresponding to the second carrier function layer may also be increased. Therefore, the design difficulty of the mask is reduced, and meanwhile the manufacturing difficulty of the corresponding first carrier function layer and the corresponding second carrier function layer is reduced, and the yield of products (including a light emitting unit, a display panel and an applied display device) is improved.

Figure 16:
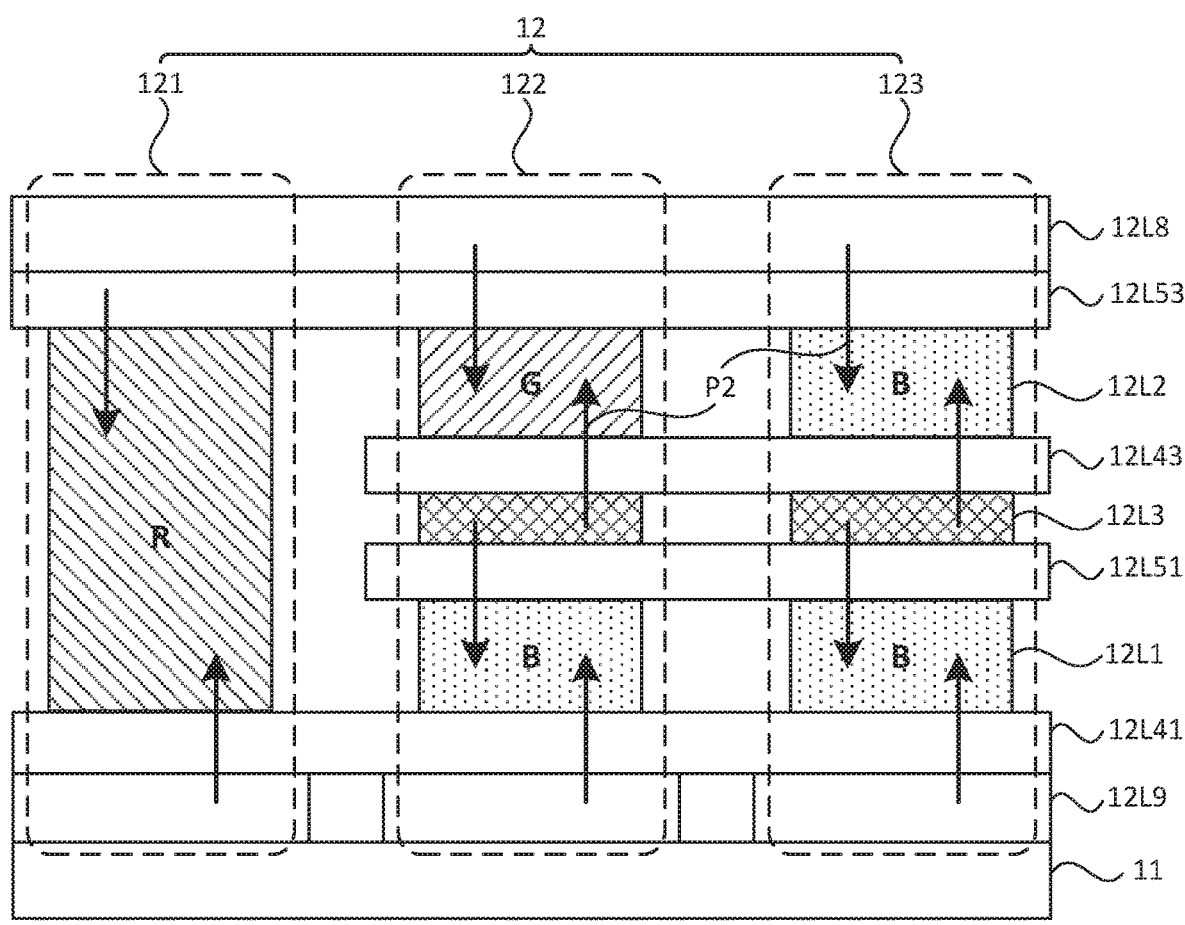
FIG. 16 is a schematic diagram of yet another light emitting unit provided in an embodiment of the present application.

FIG. 16 only exemplarily shows that the second light emitting subunit 122 and the third light emitting subunit 123 each include two first carrier function layers (the first hole auxiliary function layer 12L41 and the third hole auxiliary function layer 12LA3) and two second carrier function layers (the first electron auxiliary function layer 12L51 and the third electron auxiliary function layer 12L53), and the first light emitting subunit 121 does not include the third hole auxiliary function layer 12LA3 and the first electron auxiliary function layer 12L51. The third hole auxiliary layer 12L43 is continuously positioned between the second light emitting subunit 122 and the third light emitting subunit 123. Meanwhile, the first electron auxiliary layer 12L51 is continuously positioned in the second light emitting subunit 122 and the third light emitting subunit 123, which is merely an exemplary illustration and not limiting. In other embodiments, the third hole auxiliary layer 12LA3 may be positioned continuously in the first light emitting subunit 121 and the third light emitting subunit 123, or the first electron auxiliary layer 12L51 may be positioned continuously in the first light emitting subunit 121 and the third light emitting subunit 123 according to the actual requirement of the display panel, which is not limited in the embodiment of the present application.

In addition, FIGS. 12 and 14 only exemplarily show three first carrier function layers and three second carrier function layers, FIGS. 13, 15 and 16 only exemplarily shows two first carrier function layers and two second carrier function layers, which are merely an exemplary illustration and not limiting. In other embodiments, the number of the first carrier function layers and the number of the second carrier function layers may be set according to actual requirement of the display panel, which is not limited in the embodiments of the present application.

Figure 17:
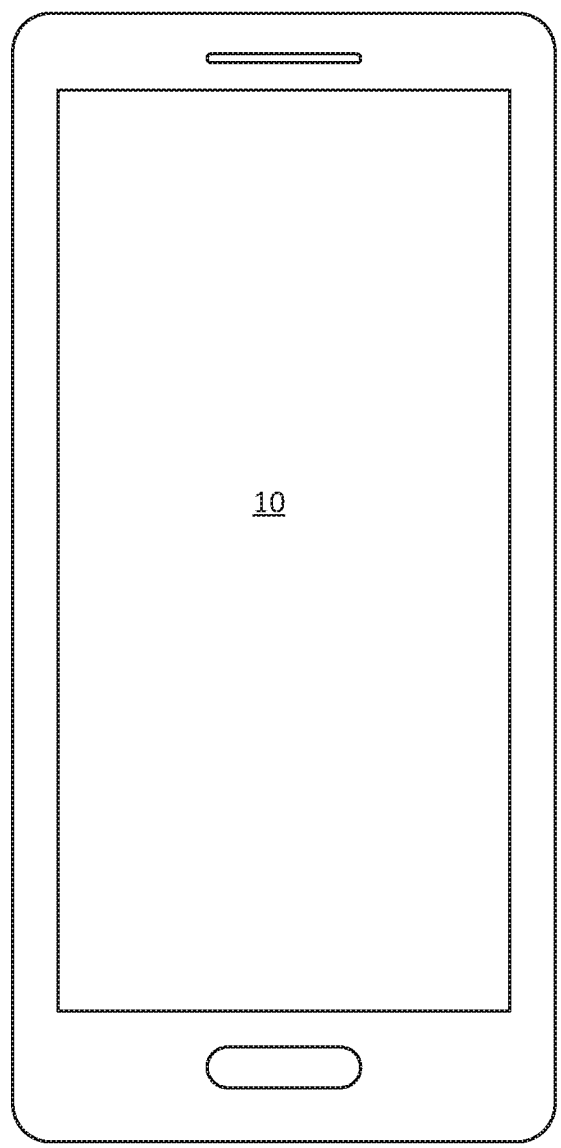
FIG. 17 is a schematic diagram of a display device provided in an embodiment of the present application.

The embodiment of the present application also provides a display device. In an embodiment, referring to FIG. 17, the display device 20 includes any one of the display panels 10 provided in the above embodiments. Therefore, the display device 20 has the beneficial effects of the display panel 10 described above, which may be understood with reference to the above description and will not be described in detail herein.

Exemplarily, the display device 20 may be a display device such as a mobile phone, a computer, and a smart wearable device, which is not limited in this embodiment of the present application.

The above-mentioned contents are only the preferred embodiments and the technical principles applied thereto of the present application. Various obvious variations, rearrangements combinations and substitutions may be made by those skilled in the art without departing from the concept of the present application, and the protection scope of the present application is defined by the appended claims.

What is claimed is:

1. A display panel, comprising:
    a substrate;
    a plurality of light emitting units positioned on one side of the substrate and arranged in an array, each of the plurality of light emitting units comprising a first light emitting subunit, a second light emitting subunit and a third light emitting subunit;
    wherein each of the plurality of light emitting unit comprises a first electrode positioned close to the substrate, a second electrode positioned opposite to the first electrode, and a second light emitting layer positioned between the first electrode and the second electrode;
    at least the third light emitting subunit comprises at least one first light emitting layer positioned between the second light emitting layer and the first electrode;
    wherein at least one of the first light emitting subunit or the second light emitting subunit comprises at least one first light emitting layer;
    wherein at least one of the number of the at least one first light emitting layer in the first light emitting subunit or the number of the at least one first light emitting layer in the second light emitting subunit is equal to the number of the at least one first light emitting layer in the third light emitting subunit;
    wherein in the first light emitting subunit, a light emitting wavelength of the first light emitting layer is less than a light emitting wavelength of the second light emitting layer,
    in the second light emitting subunit, a light emitting wavelength of the first light emitting layer is less than a light emitting wavelength of the second light emitting layer, and
    in the third light emitting subunit, a light emitting wavelength of the first light emitting layer is less than or equal to a light emitting wavelength of the second light emitting layer.

2. The display panel of claim 1, wherein a light emitting color of the first light emitting layer is blue,
    a light emitting color of the second light emitting layer in the first light emitting subunit is red, a light emitting color of the second light emitting layer in the second light emitting subunit is green, and a light emitting color of the second light emitting layer in the third light emitting subunit is blue.

3. The display panel of claim 1, wherein the light emitting unit further comprises a charge generation layer,
    the charge generation layer is positioned between the first light emitting layer and the second light emitting layer adjacent to each other,
    in a case where the number of the first light emitting layer is at least two, the charge generation layer is further positioned between two adjacent first light emitting layers.

4. The display panel of claim 3, wherein at least two of the charge generation layer in the first light emitting subunit, the charge generation layer in the second light emitting subunit and the charge generation layer in the third light emitting subunit are continuously positioned.

5. The display panel of claim 3, wherein a thickness of the charge generation layer is represented by A, $10\ nm \leq A \leq 30\ nm$.

6. The display panel of claim 3, wherein the light emitting unit further comprises a first carrier function layer and a second carrier function layer;
    the first carrier function layer is positioned between the first electrode and a first light emitting layer adjacent to the first electrode, between the first light emitting layer and the charge generation layer adjacent to the first light emitting layer and close to the first electrode, and between the second light emitting layer and the charge generation layer immediately adjacent to the second light emitting layer;
    the second carrier function layer is positioned between the second electrode and the second light emitting layer, and between the first light emitting layer and the charge generation layer immediately adjacent to the first light emitting layer and close to the second electrode.

7. The display panel of claim 6, wherein in a same light emitting unit, the first carrier function layer in at least part of the first light emitting subunit, the first carrier function layer in at least part of the second light emitting subunit, and the first carrier function layer in at least part of the third light emitting subunit are continuously positioned.

8. The display panel of claim 6, wherein in a same light emitting unit, the second carrier function layer in at least part of the first light emitting subunit, the second carrier function layer in at least part of the second light emitting subunit, and the second carrier function layer in at least part of the third light emitting subunit are continuously positioned.

9. The display panel of claim 6, wherein in a same light emitting unit, the first carrier function layer in at least part of the first light emitting subunit, the first carrier function layer in at least part of the second light emitting subunit, and the first carrier function layer in at least part of the third light emitting subunit are continuously positioned; and the second carrier function layer in at least part of the first light emitting subunit, the second carrier function layer in at least part of the second light emitting subunit, and the second carrier function layer in at least part of the third light emitting subunit are continuously positioned.

10. A display panel, comprising:

a substrate;

a plurality of light emitting units positioned on one side of the substrate and arranged in an array, each of the plurality of light emitting units comprising a first light emitting subunit, a second light emitting subunit and a third light emitting subunit;

wherein each of the plurality of light emitting unit comprises a first electrode positioned close to the substrate, a second electrode positioned opposite to the first electrode, and a second light emitting layer positioned between the first electrode and the second electrode;

at least the third light emitting subunit comprises at least one first light emitting layer positioned between the second light emitting layer and the first electrode, in the third light emitting subunit, a light emitting wavelength of the first light emitting layer is less than or equal to a light emitting wavelength of the second light emitting layer.

11. The display panel of claim 10, wherein at least one of the first light emitting subunit or the second light emitting subunit comprises at least one first light emitting layer.

12. The display panel of claim 11, wherein at least one of the number of the at least one first light emitting layer in the first light emitting subunit or the number of the at least one first light emitting layer in the second light emitting subunit is equal to the number of the at least one first light emitting layer in the third light emitting subunit.

13. The display panel of claim 12, wherein a light emitting color of the first light emitting layer is blue, a light emitting color of the second light emitting layer in the first light emitting subunit is red, a light emitting color of the second light emitting layer in the second light emitting subunit is green, and a light emitting color of the second light emitting layer in the third light emitting subunit is blue.

14. A display panel, comprising:

a substrate;

a plurality of light emitting units positioned on one side of the substrate and arranged in an array, each of the plurality of light emitting units comprising a first light emitting subunit, a second light emitting subunit and a third light emitting subunit;

wherein each of the plurality of light emitting unit comprises a first electrode positioned close to the substrate, a second electrode positioned opposite to the first electrode, and a second light emitting layer positioned between the first electrode and the second electrode;

at least the third light emitting subunit comprises at least one first light emitting layer positioned between the second light emitting layer and the first electrode, wherein the light emitting unit further comprises a charge generation layer, the charge generation layer is positioned between the first light emitting layer and the second light emitting layer adjacent to each other, in a case where the number of the first light emitting layer is at least two, the charge generation layer is further positioned between two adjacent first light emitting layers.

15. The display panel of claim 14, wherein at least one of the first light emitting subunit or the second light emitting subunit comprises at least one first light emitting layer.

16. The display panel of claim 15, wherein at least two of the charge generation layer in the first light emitting subunit, the charge generation layer in the second light emitting subunit and the charge generation layer in the third light emitting subunit are continuously positioned.

17. The display panel of claim 15, wherein the light emitting unit further comprises a first carrier function layer and a second carrier function layer;

the first carrier function layer is positioned between the first electrode and a first light emitting layer adjacent to the first electrode, between the first light emitting layer and the charge generation layer adjacent to the first light emitting layer and close to the first electrode, and between the second light emitting layer and the charge generation layer immediately adjacent to the second light emitting layer;

the second carrier function layer is positioned between the second electrode and the second light emitting layer, and between the first light emitting layer and the charge generation layer immediately adjacent to the first light emitting layer and close to the second electrode.

18. The display panel of claim 17, wherein in a same light emitting unit, the first carrier function layer in at least part of the first light emitting subunit, the first carrier function layer in at least part of the second light emitting subunit, and the first carrier function layer in at least part of the third light emitting subunit are continuously positioned.

19. The display panel of claim 17, wherein in a same light emitting unit, the second carrier function layer in at least part of the first light emitting subunit, the second carrier function layer in at least part of the second light emitting subunit, and the second carrier function layer in at least part of the third light emitting subunit are continuously positioned.

20. The display panel of claim 17, wherein in a same light emitting unit, the first carrier function layer in at least part of the first light emitting subunit, the first carrier function layer in at least part of the second light emitting subunit, and the first carrier function layer in at least part of the third light emitting subunit are continuously positioned; and the second carrier function layer in at least part of the first light emitting subunit, the second carrier function layer in at least part of the second light emitting subunit, and the second carrier function layer in at least part of the third light emitting subunit are continuously positioned.

* * * * *